(12) United States Patent
Zanker et al.

(10) Patent No.: US 10,639,803 B2
(45) Date of Patent: May 5, 2020

(54) INTERFACE MODULE FOR A GRIPPING DEVICE AND A ROBOT EQUIPPED THEREWITH

(71) Applicant: FESTO AG & Co. KG, Esslingen (DE)

(72) Inventors: Michael Zanker, Esslingen (DE); Timo Zimmermann, Wendlingen (DE)

(73) Assignee: FESTO SE & CO. KG, Esslingen (DE)

( * ) Notice: Subject to any disclaimer, the term of this patent is extended or adjusted under 35 U.S.C. 154(b) by 0 days.

(21) Appl. No.: 16/365,241

(22) Filed: Mar. 26, 2019

(65) Prior Publication Data
US 2019/0315000 A1 Oct. 17, 2019

(30) Foreign Application Priority Data
Apr. 13, 2018 (DE) ........................ 10 2018 205 642

(51) Int. Cl.
*B25J 15/04* (2006.01)
*B25J 15/02* (2006.01)
*B25J 9/08* (2006.01)
*H01L 21/687* (2006.01)

(52) U.S. Cl.
CPC .................. *B25J 15/04* (2013.01); *B25J 9/08* (2013.01); *B25J 15/0206* (2013.01); *H01L 21/68707* (2013.01)

(58) Field of Classification Search
CPC .......... B25J 15/04; B25J 15/0206; B25J 9/08; H01L 21/68707

USPC ................ 294/183, 185, 188, 192, 194, 202
See application file for complete search history.

(56) References Cited

U.S. PATENT DOCUMENTS

| | | | | |
|---|---|---|---|---|
| 4,336,926 A | * | 6/1982 | Inagaki ................ | B25J 15/0286 269/218 |
| 4,529,432 A | * | 7/1985 | Nebelung ............... | C03B 9/447 294/115 |
| RE33,317 E | * | 8/1990 | Yuda .................... | B25J 15/0206 294/115 |
| 4,975,605 A | * | 12/1990 | Bazes .................... | G11C 19/00 327/161 |
| 5,284,375 A | * | 2/1994 | Land, III ............... | E21B 19/14 294/115 |

(Continued)

FOREIGN PATENT DOCUMENTS

DE 19533948 A1 5/1996
DE 102010013617 B4 10/2011

*Primary Examiner* — Paul T Chin
(74) *Attorney, Agent, or Firm* — Hoffmann & Baron, LLP

(57) ABSTRACT

An interface module designed for installing a pneumatically actuated gripping device on a robot arm includes a first fastening interface for installation on the robot arm and a second fastening interface for installation of the gripping device. First pneumatic connections serve for the connection to a pressure source and a pressure sink, while second pneumatic connections serve for the fluidic connection to the gripping device. The interface module contains a control valve device, by way of which the gripping device is pneumatically actuatable and which is, in turn, controllable by means of valve control signals, which are provided by an internal electronic control unit, which communicates with an external electronic control device. A robot equipped with such an interface module is further proposed.

23 Claims, 1 Drawing Sheet

(56) References Cited

U.S. PATENT DOCUMENTS

| | | | | |
|---|---|---|---|---|
| 5,639,136 A * | 6/1997 | Rosengren | ............... | B25J 9/146 |
| | | | | 294/115 |
| 8,011,426 B1 * | 9/2011 | Orgeron | ................. | B25B 5/061 |
| | | | | 166/77.51 |
| 2006/0248960 A1 * | 11/2006 | Liskow | .................... | B25J 15/00 |
| | | | | 73/856 |
| 2014/0156066 A1 * | 6/2014 | Sakano | ................. | B25J 13/082 |
| | | | | 700/245 |
| 2015/0374445 A1 * | 12/2015 | Gombert | ............. | B25J 15/0206 |
| | | | | 606/130 |
| 2018/0093379 A1 * | 4/2018 | Shimodaira | .......... | B25J 15/0206 |

* cited by examiner

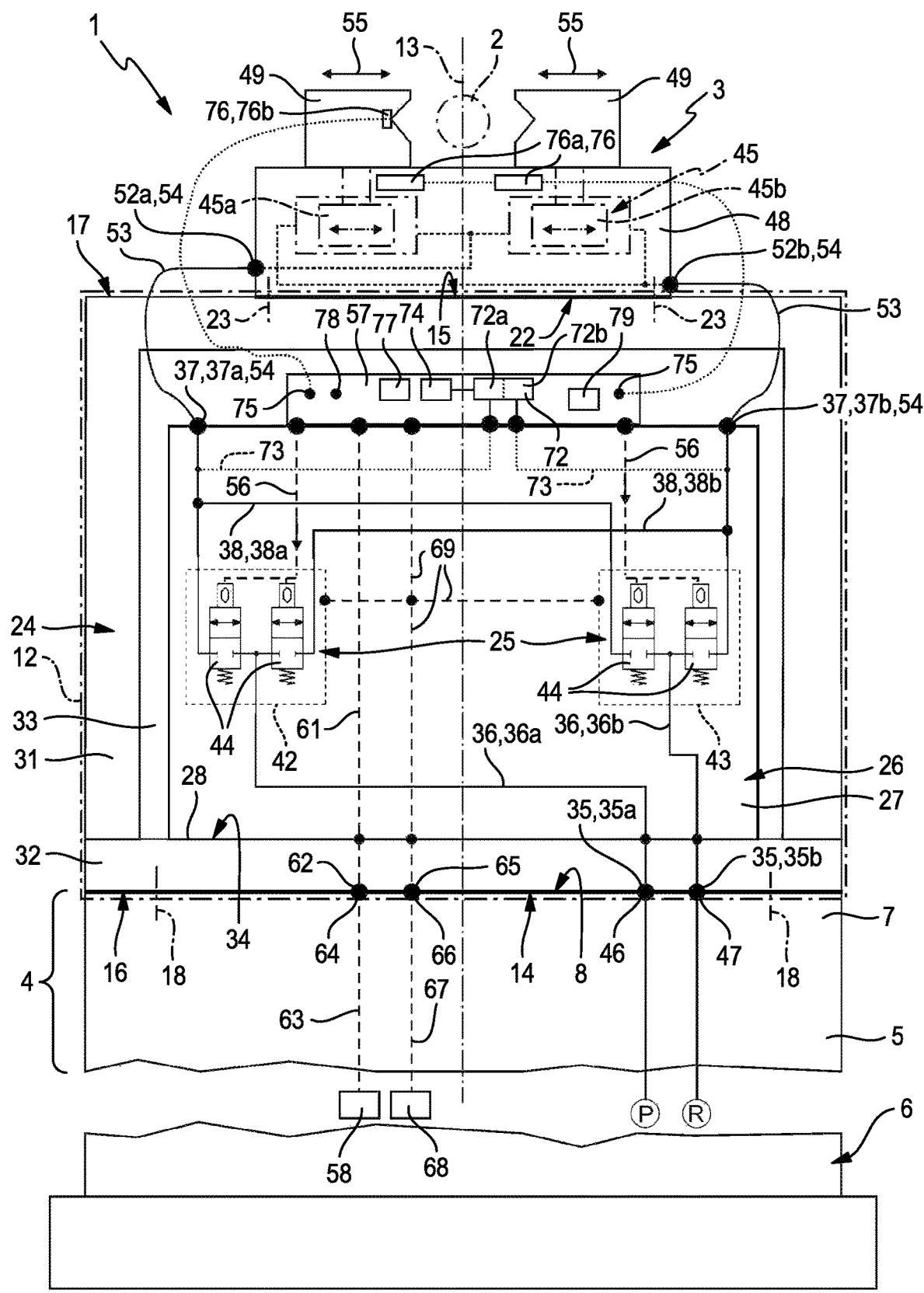

INTERFACE MODULE FOR A GRIPPING DEVICE AND A ROBOT EQUIPPED THEREWITH

BACKGROUND OF THE INVENTION

The invention relates to an interface module for installing a pneumatically actuated gripping device on the robot arm of a robot.

The invention further relates to a robot with a robot arm, which has a robot arm interface on a distal end region, and with a pneumatically actuated gripping device, which has a gripper interface, via which the gripping device is attached to the robot arm interface.

A robot of the aforementioned type is known from DE 10 2010 013 617 B4, which has an electromotively movable robot arm, on whose distal end region a pneumatically actuated gripping device is fastened. On the end face at the distal end region of the robot arm, a robot arm interface is located to which the gripping device is directly mechanically fastened with an adapted gripper interface. The pneumatic actuation of the gripping device usually takes place by means of pressurised air hoses in such a case, which are laid through the robot arm and are connected to an external control valve device arranged outside of the robot arm. The external control valve device is electrically actuatable in order to therefore actuate the gripping device during normal operation virtually through the robot arm.

DE 195 33 948 A1 discloses an energy distributor for robots which is designed as a connecting element mounted between the robot and a robot tool. The energy distributor contains an on-board computer designed to operate control units such as valves and switches. The energy distributor has a box-shaped housing which is closed by a top which has an opening for the passage of control and energy leads. The computer is contained inside a modular block which is connected to another module containing control valves and to which is connected a plate containing electrical sockets and other energy transmission means.

SUMMARY OF THE INVENTION

The object underlying the invention is to take measures, which allow simple fitting of robot arms with gripping devices and also favour a cost-effective operational actuation of simply constructed gripping devices.

This object is achieved by an interface module for installing a pneumatically actuated gripping device on the robot arm of a robot, which has the following:
(a) a first fastening interface, which is designed for mechanical fastening on a robot arm interface arranged on the robot arm,
(b) first pneumatic connections for fluidic connection to a pressurised air source and to a pressure sink,
(c) a second fastening interface, which is designed for the mechanical fastening of a pneumatically actuated gripping device,
(d) second pneumatic connections for fluidic connection to a pneumatically actuated gripping device fastened to the second fastening interface,
(e) an electrically actuatable control valve device fluidically connected via a first fluid channel system to the first pneumatic connections and via a second fluid channel system to the second pneumatic connections, which is designed to be able to control, on the basis of electric valve control signals supplied to it, the output, return flow and blocking of pressurised air to the second pneumatic connections,
(f) an internal electronic control unit, which is electrically connected to the electrically actuatable control valve device and through which the electric valve control signals for the control valve device are generatable and
(g) an internal electric control bus through which the internal electronic control unit is connected to an electric control connection device of the interface module to which an external electric control bus communicating with a superordinate external electronic control device is connectable.

The object is further achieved in the case of a robot having the features mentioned at the outset in that an interface module designed in the aforementioned sense is incorporated between the robot arm interface and the gripper interface, which is fastened with its first fastening interface to the robot arm interface and with its second fastening interface to the gripper interface.

In this manner, various gripping tasks can be very precisely handled by means of a robot using simply and cost-effectively constructed gripping devices. The interface module is incorporated between the robot arm and the gripping device selected for the respective application case such that the gripping device is not fastened, as usual thus far, directly to the robot arm interface of the robot arm, but rather to the interface module, which is in turn fastened to the robot arm interface. The interface module is an intelligent module and contains both a control valve device used for the pneumatic actuation of the gripping device and also an internal electronic control unit capable of generating electric valve control signals and transmitting them to the control valve device in order to thereby control whether an output of pressurised air takes place to the second pneumatic connections fluidically connected to the gripping device, a return flow of pressurised air takes place or, in order to stabilise a current operational state, the pressurised air flow is blocked. Since the signal processing for the electric actuation of the control valve device takes place directly in the interface module, the electric line connections are very short and accordingly less prone to faults. The integration of the control valve device into the interface module leads to short flow paths when the gripping device is actuated, which results in very good response behaviour with less inertia. The pressurised air supply and pressurised air disposal of the control valve device preferably taking place through the robot arm can take place in an uncontrolled manner such that the technical valve effort for the robot as such is very low. A superordinate external, i.e. arranged outside of the robot arm, electronic control device can be used for the coordination of the function of the gripping device with the otherwise commanded movement of the robot arm, said electronic control device communicates with an internal electric control bus of the interface module via an electric control connection device of the interface module, which is connected to the internal electronic control unit. A serial bus system is expediently used for the exchange of information with the external electronic control device, for example a so-called "CAN Bus".

If a robot arm is supposed to be retrofitted with respect to the gripping task to be performed, the interface module normally remains on the robot arm interface of the robot arm and only the pneumatically actuated gripping device is exchanged. The gripper interface can be located directly on a gripper housing of the gripping device depending on the type of gripping device or on an adapter plate of the gripping device to which the gripping device is fastened with its gripper housing and which is adapted either individually to the gripper housing or has a quick-change system suitable for the gripper housing of different gripping devices. The interface module allows for the advantageous possibility of equipping a robot arm with standard gripping devices not especially adapted for robot technology and still handling complex gripping tasks. The interface module is not exclusively suitable, but in a particular manner for equipping robots which are implemented as so-called collaborative robots and in the case of their use a division of tasks takes place with measures performed in parallel by human hands.

Advantageous further developments of the invention are described in the dependent claims.

The first pneumatic connections are expediently arranged on the first fastening interface. This is in particular such that the first pneumatic connections are automatically connected with pneumatic robot arm connections arranged on the robot arm interface if the interface module is mounted with its first fastening interface on the robot arm interface. In this case, the robot arm interface has pneumatic robot arm connections, which are connected to the external pressurised air source and pressurised air sink and which are designed for an automatic detachable coupling with the first pneumatic connections.

In particular, but not exclusively in connection with the retrofitting of existing robot arms, there is alternatively the possibility of providing the first pneumatic connections away from the first fastening interface and for example designing them as hose connection devices which allow pressurised air hoses to be relied upon to establish a fluidic connection between the first pneumatic connections and the pneumatic robot arm connections arranged in this case away from the robot arm interface on the robot arm.

The electric control connection device is in particular arranged on the first fastening interface such that the electric robot arm control connection device arranged on the robot arm interface is automatically connected when the interface module is installed with its first fastening interface on the robot arm interface. The electric robot arm control connection device is in this case attached to the robot arm interface and is connected to the external control bus communicating with the superordinate external electronic control device.

As already in the case of the pressurised air transfer between the robot arm and the interface module, there is also the possibility for the transfer of the electric control signals to install the electric control connection device of the interface module and the electric robot arm control connection device away from the interfaces and to connect them to one another in this case by means of an electric cable connection.

The internal electric control bus may already be sufficient to supply the components to be actuated with the required operational voltage. However, it may, in principle, be more advantageous for the interface module to contain an internal electric operational voltage distribution line in addition to the internal electric control bus, which is connected to the internal electronic control unit and to the electrically actuatable control valve device and which is also connected to an electric operational voltage connection device of the interface module to which an external operational voltage line connected to an external operational voltage source is connectable or is connected. The external operational voltage source provides for example a 24 volt operational voltage.

It is also advantageous for the transfer of the required operational voltage if the electric operational voltage connection device is attached to the first fastening interface of the interface module such that it is automatically connected to a robot arm operational voltage connection device of the external operational voltage line arranged on the robot arm interface if the interface module is mounted with its first fastening interface on the robot arm interface. Alternatively, the electric connection devices can also be placed away from the assigned interface and be connected to one another by electric cable connections.

In particular to enable the attachment of standard gripping devices, it is advantageous for the second pneumatic connections to be arranged on the interface module away from the second fastening interface such that they are not influenced when the gripping device is mounted with the gripper interface on the second fastening interface. The second pneumatic connections are in this case expediently equipped with hose connection devices which allow the connection of pressurised air hoses by way of which a fluidic connection can be established or is established with the pneumatic gripping device.

However, there is also the advantageous possibility of the second pneumatic connections being installed directly on the second fastening interface such that they are automatically fluidically connected to pneumatic gripper connections when the gripping device is attached to the second fastening interface.

The interface module is preferably equipped with a pressure detection device designed to detect the fluid pressure prevailing in the second fluid channel system. Therefore, in each case, the fluid pressure is detected which prevails in the fluid channels of the second fluid channel system leading to the gripping device. The pressure detection device is connected to the internal electronic control unit, which is designed to perform a pressure-regulated actuation of the control valve device and namely on the basis of the pressure values detected by the pressure detection device. The internal electronic control unit is for this purpose equipped with means, which define a pressure regulator device. Overall, a pressure-regulated operation of the pneumatically actuated gripping device is possible in this manner. In particular, pressure regulation is possible for the air intake and outlet operation of an internal pneumatic drive device of the gripping device driving the gripping jaws of the gripping device.

The pressure detection device is expediently integrated into the internal electronic control unit. This simplifies the electric wiring and the assembly of the interface module.

The internal electronic control unit expediently comprises a circuit board fitted with electronic components, which is also fitted with the components of the pressure detection device.

The internal electronic control unit is expediently directly fastened to the control valve device. As a result, the electric contact is simplified and particularly compact dimensions can be achieved. The control valve device can act as a support of the electronic control unit.

Moreover, it is advantageous for the interface module to have one or a plurality of electric input connections electrically connected to the internal electronic control unit. Each input connection is designed to be able to connect at least one sensor designed to detect operating parameters of the gripping device. For example, a position sensor is connected to an electric input connection, which can detect the position of the gripping jaws of the gripping device and can report it to the internal electronic control unit as position data. Based on this position data, position regulation can for example be performed or even only monitoring of certain operational positions for the coordination of the gripper function with the function of other equipment and/or with the movements of the robot arm.

A force sensor can be connected to at least one input connection, in particular to determine the gripping force currently exerted by the gripping device on a gripped object. Such a force sensor can for example be integrated into at least one gripping jaw of the gripping device. In connection with a correspondingly designed internal electronic control unit, gripping force regulation of the gripping device is thereby advantageously possible.

The interface module is expediently provided with at least one electric output connection, which is electrically connected to the internal electronic control unit and which is for example designed to output status information, for example that an object to be gripped is actually gripped or has currently been released.

The interface module can also have at least one optical display device actuatable by the internal electronic control unit. Such an optical display device is in particular designed in order to visualise one or a plurality of operating states of the connected gripping device and/or of components of the interface module. For example, it can be displayed by a light output that the control valve device is currently actuated in the sense of generating a gripping operation or in the sense of generating a release operation of the gripping device. The optical information can be visualised with different light colours depending on the status.

The first fastening interface is preferably designed on a rigid coupling plate, in particular consisting of metal, of the interface module, this coupling plate preferably supporting the control valve device.

The coupling plate is expediently a constituent of an internal rigid force transfer structure of the interface module to which the second fastening interface is also attached. The second fastening interface is preferably located on a rigid coupling bridge of the force transfer structure, which is mechanically fastened to the coupling plate and which bridges the control valve device and the internal electronic control unit attached thereto. The coupling bridge is for example designed in the shape of a cup such that together with the coupling plate it defines a receiving space in which the control valve device is received.

The control valve device is preferably a constituent of a control valve block in which all valve components are integrated and which has a block body via which the control valve device is fixed to the force transfer structure.

It is advantageous for the control valve device to be designed with proportional technology. This favours the already mentioned pressure regulation and allows a very sensitive, continuous positioning of the gripping jaws of the gripping device and/or dosing of the gripping force. The control valve device preferably has a plurality of individual, individually electrically actuatable control valves, which are in particular designed as piezo valves, but which can, however, also be readily implemented for example as magnetic valves.

It is particularly advantageous for the control valve device to consist of a plurality of individual control valves, which have a 2/2 valve functionality and which are connected together in pairs such that a control valve unit can in each case be achieved with a 3/3 valve functionality.

BRIEF DESCRIPTION OF THE DRAWING

The invention is explained in more detail below with reference to the attached drawing.

FIG. 1 is a schematic representation of a robot comprising a robot arm and designed according to the invention, which is equipped with an advantageously designed interface module according to the invention.

DETAILED DESCRIPTION

A robot 1 is illustrated quite schematically in FIG. 1, which is used for handling purposes and is usable in this connection in order to reposition any objects 2, of which one is indicated with a dot-dashed line. The robot 1 can for example be an industrial robot, but is preferably designed as a collaborative robot.

The repositioning of objects 2 takes place for example when assembling devices or in the packaging industry. These applications should not be understood as being exhaustive.

The repositioned object 2 is grippable by means of a pneumatically actuatable gripping device 3 of the robot 1 and can be released again at any time to be deposited at the desired location. A repositioning operation taking place when handling the object 2 can be generated by corresponding movement of a robot arm 4 of the robot 1. The robot arm 4 depicted only schematically has at least one, but generally a plurality of arm members 5, directly consecutive arm members 5 being fastened to one another so as to be swivelable relative to one another by means of a robot arm joint.

The robot 1 has a base section 6, which supports the robot arm 4 and via which the robot 1 is fixable to a support structure, for example on a base. The base section 6 has for example a foot part stationary during the operation of the robot and a support column rotatable around a vertical axis in this respect and supporting the robot arm 4.

The robot arm 4 or its arm members 5 are movable in the space for which purpose the robot 1 has suitable drive means which are not depicted further and which for example consist of pneumatically actuated drive devices, in particular rotational drive devices. The drive means can, however, also be at least partially of an electromotive nature.

The robot arm 4 has a distal end region 7 opposed to the base section 6, on which a robot arm interface 8 is formed on the end face, which is a fastening interface, which is used for the mechanical fastening of the gripping device 3. However, the gripping device 3 is not directly fastened to the robot arm interface 8, but rather with interconnection of a special interface module 12, whose components are framed in the dot-dashed manner for better clarity.

The interface module 12 has a first fastening interface 14 and a second fastening interface 15 separated in this respect.

The interface module 12 has an imaginary central longitudinal axis 13 with a rear end face 16 and a front end face 17 oriented axially opposed in this respect. The first fastening interface 14 is preferably formed on the rear end face 16 and the second fastening interface 15 on the front end face 17 of the interface module 12.

Overall, the interface module 12 is for example designed in a block shape or disc shape.

The first fastening interface 14 is designed for the mechanical fastening of the interface module 12 on the robot arm interface 8. The state of the interface module 12 and the robot arm 4 fastened to one another is illustrated. Fastening means serving for the fastening are schematically indicated by 18 and for example define a screw connection device. The fastening means 18 are in particular designed for the detachable fastening of the interface module 12 on the robot arm 4. The first fastening interface 14 expediently abuts on the robot arm interface 8 in the state when they are fastened to one another.

The second fastening interface 15 serves for the detachable fastening of the gripping device 3 on the interface module 12. The state of the gripping device 3 and the interface module 12 when they are fastened to one another is illustrated. The gripping device 3 has a fastening interface designated as gripper interface 22 by means of which the gripping device 3 is attached to the second fastening interface 15 of the interface module 12 in the assembled state. Fastening means 23 serving for the detachable fastening are schematically indicated and for example consist of a screw connection device or of a quick-change clamping system.

For example, the two fastening interfaces 14, 15 are formed on a rigid force transfer structure 24 of the interface module 12. This is for example shaped in the manner of a frame when viewed in the cross-section. The force transfer structure 24 in particular consists of metal and assumes the force flow from the robot arm 4 to the gripping device 3.

The interface module 12 contains an electrically actuatable control valve device 25. The same is preferably integrated into a control valve block 26. The individual components of the control valve device 25 are preferably received in a rigid block body 27 of the control valve block 26.

The control valve device 25 is fastened on the force transfer structure 24. The fastening preferably takes place via the control valve block 26, which is for example fastened in a joining region 28 on a coupling plate 32 of the force transfer structure 24.

The coupling plate 32 of the force transfer structure 24 comprises the first fastening interface 14 in the exemplary embodiment and is aligned such that its plate plane runs at right angles to the longitudinal axis 13.

The force transfer structure 24 expediently surrounds a receiving space 33 in which the control valve device 25 and for example the entire control valve block 26 are received. The receiving space 33 can be closed all around or also be partially open. The control valve block 26 is in particular fastened on a front plate surface 34 of the coupling plate 32 opposed to the first fastening interface 14. The fastening takes place in particular by way of a screw connection. The transition region between the front plate surface 34 and the control valve block 26 defines the already mentioned joining region 28.

The second fastening interface 15 is preferably located on a rigid coupling bridge 31 of the force transfer structure 14. The same is for example, like the control valve block 26, fastened to the front plate surface 34 of the coupling plate 32. The coupling bridge 31 together with the coupling plate 32 surrounds the receiving space 33. The coupling bridge 31 can for example be formed in the manner of a cover.

The interface module 12 has first pneumatic connections 35, which comprise a pneumatic input connection 35a and a pneumatic output connection 35b. These first pneumatic connections 35 are preferably arranged on the first fastening interface 14.

The first pneumatic connections 35 are in constant fluidic connection with the control valve device 25 via a first fluid channel system 36, which is formed in the interface module 12. For example, the first fluid channel system 36 comprises an input channel 36a connected to the pneumatic input connection 35a and an output channel 36b connected to the pneumatic output connection 35b.

The interface module 12 is moreover equipped with second pneumatic connections 37, which are also in constant fluidic connection to the control valve device 25 via an internal second fluid channel system 38. The second pneumatic connections 37 define a first pneumatic working connection 37a and a second pneumatic working connection 37b.

The control valve device 25 preferably contains two functionally separated control valve units 42, 43, which are identified in FIG. 1 with a dashed border and which are also designated below as first and second control valve unit 42, 43. Each of these two control valve units 42, 43 can fulfil the function of a 3/3 way valve. It is advantageous for each control valve unit 42, 43 to be composed of two individually electrically actuatable control valves 44 which are a 2/2 way valve in each case.

While the input channel 36a is connected to the first control valve unit 42, the output channel 36b is connected to the second control valve unit 43.

The two pneumatic working connections 37a, 37b are in each case connected both to the first control valve unit 42 and to the second control valve unit 43. The fluidic connection of the first pneumatic working connection 37a to the two control valve units 42, 43 takes place via a first fluid channel network 38a of the second fluid channel system 38. The fluidic connection of the second pneumatic working connection 37b with the two control valve units 42, 43 takes place via a second fluid channel network 38b of the second fluid channel system 38.

The first pneumatic connections 35 serve for the fluidic connection to an external pressurised air source P and a pressure sink R formed in particular by the atmosphere. The second pneumatic connections 37 serve for the fluidic connection with the gripping device 3, which is equipped with a pneumatic drive device 45, which is actuatable by controlled pressurised air application.

First and second pneumatic robot arm connections 46, 47 assigned to the first pneumatic connections 35 are formed on the robot arm interface 8. The first pneumatic robot arm connection 46 is constantly connected to the pressurised air source P, the second pneumatic robot arm connection 47 is constantly connected to the pressure sink R. Pressurised air hoses are in particular used for the fluidic connection which are laid in the interior of the robot arm 4.

When installing the first fastening interface 14 on the robot arm interface 8, the pneumatic input connection 35a is connected to the first pneumatic robot arm connection 46 and the pneumatic output connections 35b are connected to the second pneumatic robot arm connection 47 such that the first control valve unit 42 is connected to the pressure source P and the second control valve unit 43 to the pressure sink R.

The gripping device 3 has a base unit 48 with a gripper housing and a plurality of gripping jaws 49 movable in this respect and relative to one another. The pneumatic drive device 45 is housed in the base unit 48, said drive device being drivingly coupled to the gripping jaws 49. A first and a second pneumatic gripper connection 52a, 52b are located outside on the base unit 48 or on the gripper housing, of which the first pneumatic gripper connection 52a is connected in a fluidically communicating manner to the first pneumatic working connection 37a and the second pneumatic gripper connection 52b to the second pneumatic working connection 37b. A pressurised air hose 53 is for example used in each case for these fluidically communicating connections, in this connection the aforementioned connections 52a, 52b, 37a, 37b being provided in each case with a hose connection device 54.

For example, the pneumatic gripper connections 52a, 52b are located away from the gripper interface 23 on the base unit 48. However, the second pneumatic connections 37 are not arranged on the second fastening interface 15, but rather on the control valve block 26. As mentioned, pressurised air hoses 53 are used for the fluidic connection.

In the case of a solution deviating from this, the mentioned connections 52a, 52b, 37 are located, on the one hand, on the gripper interface 22 and, on the other hand, on the second fastening interface 15 and namely such that a correctly assigned fluidic connection is automatically established when the gripping device 3 is attached with its gripper interface 22 to the second fastening interface 15 of the interface module 12.

The pneumatic drive unit 45 expediently contains, for each gripping jaw 49, a dual acting piston drive with drive chambers indicated with a dot-dashed line to which pressurised air can be applied in a controlled manner such that a drive piston 45a, 45b located therein in each case and movably coupled with a gripping jaw 49 is driven into a linear movement from which results a gripping jaw movement 55 indicated by a double arrow.

Electric valve control signals can be supplied to the electrically actuatable control valves 44 of the control valve device 25 via electric control lines 56, said electric valve control signals predefine the valve position of the individual control valves 44. In this manner, the output, the return flow and the blocking of pressurised air to the second pneumatic connections 37 can be controlled. Each second pneumatic connection 37 can thus be influenced such that pressurised air is output to the gripping device 3 at said connection, that pressurised air coming from the gripping device 3 can flow back through said connection or that the pressurised air flow is prevented. The latter means that the pressurised air is confined on the gripper side.

The pressurised air that can be output comes from the pressurised air source P, the returning pressurised air is channelled to the pressure sink R. In both cases, the pressurised air flows through the control valve device 25. Depending on the flow direction, the gripping jaws 49 are moved towards one another or away from one another. If the pressurised air is sealed off, the gripping jaws 49 remain in the current position.

The electric valve control signals for the control valve device 25 are generated by an internal electronic control unit 57 of the interface module 12. It is electrically connected to the electrically actuatable control valve device 25 via the electric control lines 56 already mentioned.

The internal electronic control unit 57 communicates for control purposes with a superordinate external electronic control device 58, which may be a constituent of the robot 1, but is arranged remote from the robot arm 4, for example in or on the base section 6. Additional electrically actuatable devices can be connected to the external electronic control device 58, for example additional robots. The superordinate external electronic control device 58 commands, inter alia, in particular the movements of the robot arm 4 and therefore the spatial movements of the gripping device 3 attached to the robot arm 4. Therefore, the superordinate external electronic control device 58 can coordinate the movement of the gripping device 3 as a whole with the gripping jaw movement 55 of the gripping jaws 49.

For the communication with the superordinate external electronic control device 58, the interface module 12 contains an internal electric control bus 61, which runs between the internal electronic control unit 57 and an electric control connection device 62 arranged outside on the interface module 12. The electric control connection device is for example attached to the first fastening interface 14. An external electric control bus 63 leading to the superordinate external electronic control device 58 runs along the robot arm 4, said control bus ending at the robot arm interface 8 with an electric robot arm control connection device 64. The latter enters into electric connection with the electric control connection device 62 when the interface module 12 is attached to the robot arm 4.

However, it is possible for the electric control connection device 62 and the electric robot arm control connection device 64 to be installed away from the first fastening interface 14 and the robot arm interface 8 such that an automatic connection when assembling the interface module 12 does not take place and a separate cable connection is provided for the electric connection.

The aforementioned also applies to the electric connection between an electric operating voltage connection device 65 arranged on the interface module 12 and a robot arm operating voltage connection device 66 arranged on the robot arm 4. The same are for example located, on the one hand, on the first fastening interface 14 and, on the other hand, on the robot arm interface 8 such that the electric connection is automatically established when assembling the interface module 12.

The robot arm operating voltage connection device 66 is connected to an external operating voltage source 68 via an external operating voltage line 67 extending along the robot arm 4, which is arranged separately to the robot arm 4 and which is located for example in or on the base section 6 or also beside the robot 1. The operating voltage source 68 for example delivers an operating voltage of 24 volts.

An internal electric operating voltage distribution line 69 runs inside the interface module 12 through which both the internal electronic control unit 37 and the electrically actuatable control valve device 25 is connected to the electric operating voltage connection device 65 in order to be supplied with the desired operating voltage and namely independently of the internal electric control bus 61.

It is, in principle, possible to use the internal electronic control unit 57 for the unregulated electric actuation of the control valve device 25. However, it is more advantageous when the internal electronic control unit 57 is designed to perform control tasks, in particular being intended for pressure regulation and/or gripping force regulation. The interface module 12 of the exemplary embodiment is designed for both control tasks.

In order to be able to perform pressure regulation, the interface module 12 contains a pressure detection device 72, which is connected to the second fluid channel system 38 and, which is capable of detecting the fluid pressure prevailing in the second fluid channel system. Both the fluid pressure assigned to the first pneumatic working connection 37a and the fluid pressure assigned to the second pneumatic working connection 37b are detectable in particular independently of one another. The pressure detection device 72, for this purpose, contains for example two separate pressure sensors 72a, 72b, of which each is connected to one of the two fluid channel networks 38a, 38b of the second fluid channel system 38, which communicate with one of the two pneumatic working connections 37a, 37b in each case.

The internal electronic control unit 57 is equipped with a pressure regulator device 74, to which the pressure detection device 72 is connected in order to process the detected pressure values.

The pressure regulation is carried out on the basis of target values, which are predefinable by the external electronic control device 58. There is therefore the advantageous possibility of carrying out pressure regulation both for the air intake and for the air output of the pneumatic drive device 45 of the gripping device 3.

The pressure detection device 72 is preferably integrated into the internal electronic control unit 57 such that separate installation is avoided.

The internal electronic control unit 57 is expediently fastened directly to the control valve device 25, preferably to the control valve block 26 that may be present. Electric and pneumatic connections to and from the internal electronic control unit 57 can be made through the control valve block 26 according to the illustration. The two fluid channel systems 36, 38 also run in the control valve block 26.

The interface module 12 preferably has at least one electric input connection 75 electrically connected to the internal electronic control unit 57. A sensor 76 can for example be connected to each electric input connection 75, which can detect operating parameters of the gripping device 3, which are to be taken into account in the case of the electric actuation of the control valve device 25. According to the exemplary embodiment, the sensors 76 can contain at least one position sensor 76a for the position detection of the gripping jaws 49 and/or at least one force sensor 76b for the detection of a gripping force exerted by the gripping jaws 49 on the object 2.

The internal electronic control unit 57 is expediently equipped with a gripping force regulator device 77, through which the gripping force to be exerted on an object 2 to be gripped is precisely regulatable or controllable such that a secure and also gentle hold on objects 2 can be ensured.

The interface module 12 is preferably equipped with at least one electric output connection 78 to which operation-related electric signals can be output, for example certain status information of the gripping device 3 and/or of the interface module 12.

The interface module 12 expediently comprises at least one optical display device 79 actuatable by the internal electronic control unit 57. This optical display device serves in particular to visualise operating statuses of the attached gripping device and/or of components of the interface module 12 by way of the output of light signals.

The control valve device 25 is preferably designed as a proportional control valve device such that it allows continuous specification of different flow rates in the case of the air intake and air output of the pneumatic drive device 45 of the gripping device 3. In this connection, the control valves 44 are designed as proportional valves. To this end, piezo valves are particularly suitable, which are also characterised by a low power consumption. However, the control valve device 25 can essentially also be implemented with switch valves and/or with electromagnetic valves.

What is claimed is:

1. An interface module for installing a pneumatically actuated gripping device on the robot arm of a robot, wherein the interface module comprises:
   (a) a first fastening interface, which is designed for mechanical fastening on a robot arm interface arranged on the robot arm;
   (b) first pneumatic connections for fluidic connection to a pressurised air source and to a pressure sink;
   (c) a second fastening interface, which is designed for the mechanical fastening of a pneumatically actuated gripping device;
   (d) second pneumatic connections for fluidic connection to a pneumatically actuated gripping device fastened to the second fastening interface;
   (e) an electrically actuatable control valve device fluidically connected via a first fluid channel system to the first pneumatic connections and via a second fluid channel system to the second pneumatic connections, said control valve device being designed to be able to control, on the basis of electric valve control signals supplied thereto, the output, return flow and blocking of pressurised air on the second pneumatic connections;
   (f) an internal electronic control unit, which is electrically connected to the electrically actuatable control valve device and through which the electric valve control signals for the control valve device can be generated; and
   (g) an internal electric control bus through which the internal electronic control unit is connected to an electric control connection device of the interface module to which an external electric control bus communicating with a superordinate external electronic control device is connectable.

2. The interface module according to claim 1, wherein the first pneumatic connections are arranged on the first fastening interface.

3. The interface module according to claim 2, wherein the first pneumatic connections are arranged on the first fastening interface such that they are automatically connectable to pneumatic robot arm connections arranged on the robot arm interface when installing the first fastening interface on the robot arm interface, said pneumatic robot arm connections being fluidically connected to a pressurised air source and to a pressure sink.

4. The interface module according to claim 1, wherein the electric control connection device is arranged on the first fastening interface such that it is automatically connectable to an electric robot arm control connection device of the external electric control bus arranged on the robot arm interface when installing the first fastening interface on the robot arm interface.

5. The interface module according to claim 1, further comprising an internal electric operating voltage distribution line, which is connected to the internal electronic control unit and to the electrically actuatable control valve device and which is also connected to an electric operating voltage connection device of the interface module, to which an external operating voltage line connected to an external operating voltage source is connectable or is connected.

6. The interface module according to claim 5, wherein the electric operating voltage connection device is arranged on the first fastening interface such that it is automatically connectable to a robot arm operating voltage connection device of the external operating voltage line arranged on the robot arm interface when installing the first fastening interface on the robot arm interface.

7. The interface module according to claim 1, wherein the second pneumatic connections are arranged away from the second fastening interface.

8. The interface module according to claim 7, wherein the second pneumatic connections are provided with hose connection devices for connecting pressurised air hoses connected or connectable to the pneumatic gripping device.

9. The interface module according to claim 1, further comprising a pressure detection device for detecting the fluid pressure prevailing in the second fluid channel system, which is electrically connected to the internal electronic control unit, wherein the internal electronic control unit contains a pressure regulator device for performing a pressure-regulated actuation of the control valve device on the basis of the pressure values detected by the pressure detection device.

10. The interface module according to claim 9, wherein the pressure detection device is integrated into the internal electronic control unit.

11. The interface module according to claim 1, wherein the internal electronic control unit is directly fastened to the control valve device.

12. The interface module according to claim 1, further comprising one or a plurality of electric input connections electrically connected to the internal electronic control unit, which are in each case designed for connecting at least one sensor designed to detect operating parameters of the gripping device.

13. The interface module according to claim 12, wherein the at least one sensor is a position sensor and/or a force sensor.

14. The interface module according to claim 1, wherein the internal electronic control unit contains a gripping force regulator device for regulating the gripping force exertable by the pneumatically actuated gripping device on an object to be gripped.

15. The interface module according to claim 1, further comprising one or a plurality of electric output connections electrically connected to the internal electronic control unit.

16. The interface module according to claim 15, wherein the at least one electric output connection is designed to output status information.

17. The interface module according to claim 1, further comprising at least one optical display device actuatable by the internal electronic control unit.

18. The interface module according to claim 17, wherein the optical display device is designed to visualise operating statuses of the connected gripping device and/or of components of the interface module.

19. The interface module according to claim 1, wherein the first fastening interface is arranged on a rigid coupling plate, supporting the control valve device, of a rigid force transfer structure comprising both fastening interfaces.

20. The interface module according to claim 19, wherein the second fastening interface is arranged on a rigid coupling bridge of the rigid force transfer structure fastened on the coupling plate independently of the control valve device.

21. The interface module according to claim 1, wherein the control valve device comprises a plurality of control valves individually actuatable by the internal electronic control unit.

22. The interface module according to claim 21, wherein the control valves are proportional valves.

23. A robot, comprising a robot arm, which has a robot arm interface on a distal end region, and comprising a pneumatically actuated gripping device, which has a gripper interface, via which the gripping device is attached to the robot arm interface, wherein an interface module is incorporated between the robot arm interface and the gripper interface, said interface module comprising:
(a) a first fastening interface, by which is fastened on the robot arm interface of the robot arm;
(b) first pneumatic connections for fluidic connection to a pressurised air source and to a pressure sink;
(c) a second fastening interface, by which it is fastened on the gripper interface of the gripping device;
(d) second pneumatic connections for fluidic connection to a pneumatically actuated gripping device fastened to the second fastening interface;
(e) an electrically actuatable control valve device fluidically connected via a first fluid channel system to the first pneumatic connections and via a second fluid channel system to the second pneumatic connections, said control valve device being designed to be able to control, on the basis of electric valve control signals supplied thereto, the output, return flow and blocking of pressurised air on the second pneumatic connections;
(f) an internal electronic control unit, which is electrically connected to the electrically actuatable control valve device and through which the electric valve control signals for the control valve device can be generated; and
(g) an internal electric control bus through which the internal electronic control unit is connected to an electric control connection device of the interface module to which an external electric control bus communicating with a superordinate external electronic control device is connectable.

* * * * *